US008030703B2

(12) United States Patent
Kotz et al.

(10) Patent No.: US 8,030,703 B2
(45) Date of Patent: Oct. 4, 2011

(54) FIELD-EFFECT TRANSISTOR AND METHOD FOR MANUFACTURING A FIELD-EFFECT TRANSISTOR

(75) Inventors: Dietmar Kotz, Moosburg (AT); Martin Poelzl, Ossiach (AT); Rudolf Zelsacher, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 484 days.

(21) Appl. No.: 11/964,202

(22) Filed: Dec. 26, 2007

(65) Prior Publication Data
US 2008/0211019 A1 Sep. 4, 2008

(30) Foreign Application Priority Data
Dec. 29, 2006 (DE) .......................... 10 2006 062 011

(51) Int. Cl.
*H01L 29/66* (2006.01)
(52) U.S. Cl. ................. 257/331; 257/330; 257/E21.428
(58) Field of Classification Search .................. 257/331, 257/E21.428
See application file for complete search history.

(56) References Cited

U.S. PATENT DOCUMENTS

| 5,637,898 A | 6/1997 | Baliga |
| 7,319,256 B1 * | 1/2008 | Kraft et al. ..................... 257/330 |
| 7,465,987 B2 * | 12/2008 | Krumrey et al. .............. 257/330 |
| 2003/0173619 A1 | 9/2003 | Feldtkeller et al. |
| 2009/0114986 A1 * | 5/2009 | Hirler et al. .................... 257/334 |

FOREIGN PATENT DOCUMENTS
EP 1170803 A2 9/2002
* cited by examiner

*Primary Examiner* — Ken A Parker
*Assistant Examiner* — Jose R Diaz
(74) *Attorney, Agent, or Firm* — Dicke, Billig & Czaja, PLLC

(57) ABSTRACT

A field-effect transistor and a method for manufacturing a field-effect transistor is disclosed. One embodiment includes a substrate having a surface along which a trench is implemented, wherein the trench has a trench bottom and a trench edge. A source area is implemented at the trench edge and a gate electrode at least partially implemented in the trench and separated from the substrate by an insulation layer. The field-effect transistor includes a drain electrode at a side of the substrate facing away from the surface. An additional electrode is implemented between the gate electrode and the trench bottom and electrically insulated from the substrate and an electrical connection between the additional electrode and the gate electrode, wherein the electrical connection has a predetermined ohmic resistance value.

20 Claims, 5 Drawing Sheets

FIELD-EFFECT TRANSISTOR AND METHOD FOR MANUFACTURING A FIELD-EFFECT TRANSISTOR

CROSS-REFERENCE TO RELATED APPLICATIONS

This Utility Patent Application claims priority to German Patent Application No. DE 10 2006 062 011.9, filed on Dec. 29, 2006, which is incorporated herein by reference.

BACKGROUND

The present invention relates to a field-effect transistor and a method for manufacturing a field-effect transistor and in one embodiment to an ohmic source-poly contact for a poly-poly MOS switch.

Increasing integration densities of semiconductors have the consequence that a limitation of power losses gains an ever greater importance. Power losses may develop in different locations. In modern integrated circuits, switches are mainly realized by transistors and for a low-loss operation it is important that in an on state, the switch operates as loss-free as possible, which corresponds to a resistance value which is as low as possible. This means, that an input resistance $R_{on}$ of the switch has to be kept as low as possible. Possible transistors which are suitable as switches are, for example, MOS power transistors which include a high switching speed. Thus, for longer phases of operation, for example, of more than one nanosecond, the input resistance $R_{on}$ of the MOS power transistor may be substantially decreased. It is desirable anyway that the input resistance value $R_{on}$ is as low as possible, but this means for example, that $R_{on}$ again drops by some percents, if the transistor remains in a on state, for example, for longer than one nanosecond, and that thus the power loss again decreases.

This improvement of the on resistance $R_{on}$ is, for example, dependent on the chip size, as only the portion of the input resistance $R_{on}$ may be improved which is formed in the channel area of the power transistor. Further influential factors which influence the input resistance $R_{on}$ are, for example, the chosen contacting of the power transistor. For a switch realized by a power transistor, thus, apart from an optimization of the terminal contacts, an optimization of the channel portion at the input resistance $R_{on}$ is desirable.

SUMMARY

Embodiments include a field-effect transistor having a substrate with a surface along which a trench is implemented, wherein the trench includes a trench bottom and a trench edge. Further, the field-effect transistor includes a source area implemented at the trench edge, a gate electrode which is at least partially implemented in the trench and separated from the substrate by an insulation layer, a drain electrode at a side of the substrate facing away from the surface. The field-effect transistor includes an additional electrode implemented between the gate electrode and the trench bottom and electrically insulated from the substrate, and an electrical connection between the additional electrode and the gate electrode, wherein the electrical connection includes a predetermined ohmic resistance value.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
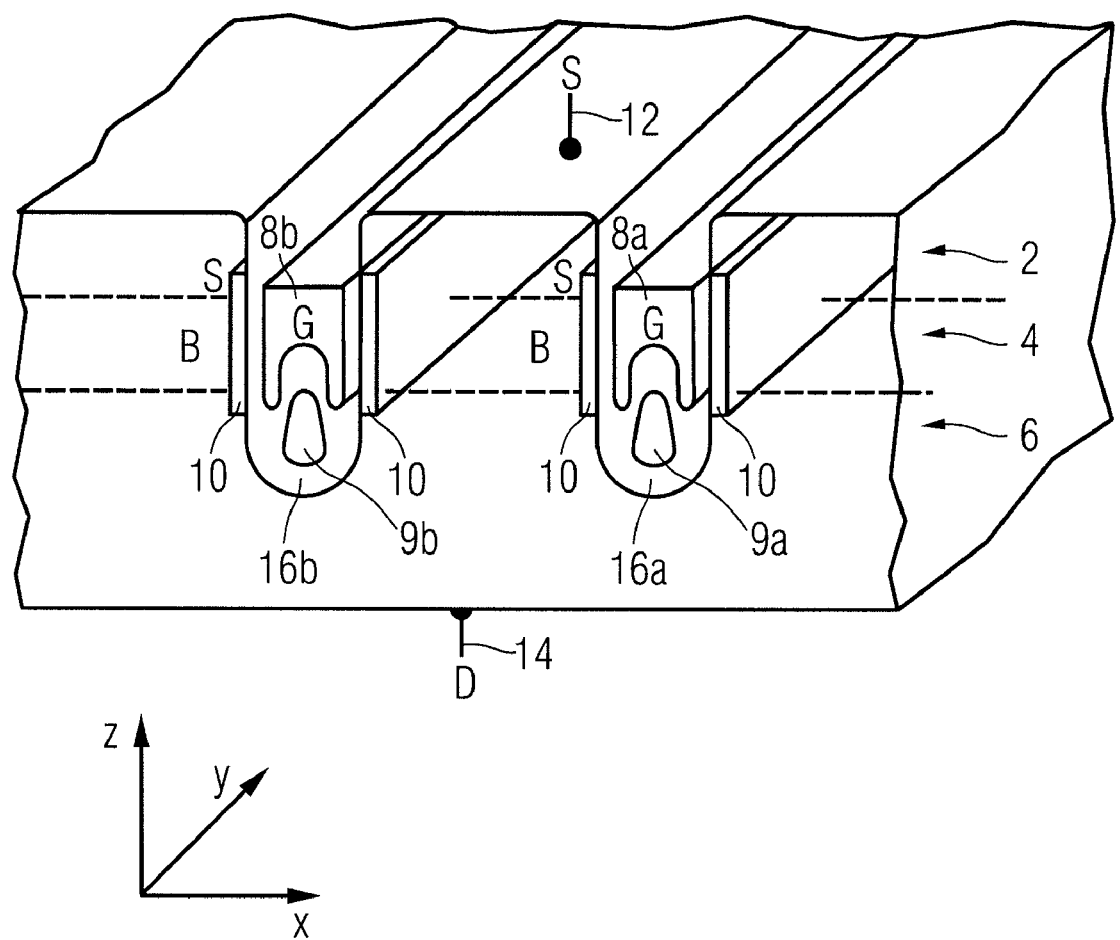
FIG. 1 illustrates a three-dimensional spatial view of a power transistor.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments of the present invention relate to a power transistor or a field-effect transistor having a gate electrode which is at least partially implemented in a trench having a trench bottom in a substrate and including an additional electrode, wherein the additional electrode is implemented between the gate electrode and the trench bottom. Both, the gate electrode and also the additional electrode are electrically insulated from the substrate by an insulation layer in the embodiments and may for example extend along the trench. The field-effect transistor includes a source area in an edge area of the trench and in addition to that a drain electrode at a side of the substrate facing away from the trench. Along a trench wall extending between the trench bottom and the trench edge, a channel area of the power transistor may form. According to embodiments, the additional electrode and the gate electrode are electrically connected to an ohmic contact, wherein the ohmic contact includes an ohmic resistance value, so that a potential equalization between the gate electrode and the additional electrode does not directly take place but with a certain time delay.

The additional electrode is also referred to as a so called source-poly, which is, in the above-described so called poly-poly MOS trench power transistors, arranged below the gate-poly (gate electrode) or, as already mentioned between the gate electrode and the trench bottom, respectively. The designation source-poly and gate-poly here refers to a use of, for example, polycrystalline silicon in the implementation of the electrodes. With conventional poly-poly MOS trench power transistors, the additional electrode (the source-poly) is charged to the source potential. As mentioned above, embodiments of the present invention include an ohmic contact between the source-poly and the gate-poly or between the source-poly and a gate voltage source, respectively. The designation ohmic contact was selected to be so general, because a main characteristic which this ohmic contact is to fulfill is that a potential equalization between the gate electrode and the additional electrode does not happen directly but only, as described above, with a certain time delay. The resistance value is here selected so that a desired time delay results. For example, the resistance value may be selected such that after a switch-on phase of 1 ns, a drop off of the on resistance value $R_{on}$ of at least 5% takes place.

The resistance (resistance value of the ohmic contact) determines the time delay with which the additional electrode (the second source-poly and, if applicable, also further source-polys) is switched on to the gate potential. The reduction in the $R_{on}$ is then exclusively dependent on this potential (and not on the resistance). For the resistance there is a formula which contains chip face, the capacity and the delay ($\Delta t$) as parameters. Thus, the voltage at the source-poly lags behind the voltage at the gate-poly, but reaches the value of the gate voltage when the transistor remains in one state (on or off) for long. This temporal lacking behind is controlled via the resistance. The improvement of $R_{on}$ then only depends on the source potential and not on the resistance.

A material for the electrodes currently is doped polysilicon (wherein also other metals are possible, for example, silicides or salicides or combinations of polysilicon and other metals, respectively). One material for the resistances is doped polysilicon (wherein also other metals are possible, for example, silicides or salicides or combinations of polysilicon and other metals, respectively) as well as doped monosilicon and any conductors used in the manufacturing of the MOS, for example, also aluminum or copper.

The ohmic contact simultaneously guarantees that the power transistor may still be switched at high speed, so that with a high-speed switching a potential equalization may hardly take place. Only for the case that the power transistor remains switched on for a longer period of time is the source-poly charged to the gate potential. This has the consequence, that the input resistance value $R_{on}$ may substantially decrease again, in one embodiment with longer on phases.

Apart from the substantial decrease of the input resistance value $R_{on}$ and the decrease of the power loss during the on state connected therewith, some embodiments, that for periods of time in which the gate voltage remains constant, no voltages are present between the gate electrode and the additional electrode, that is, between the two polys (the gate- and the source-poly). Thus, the pressure on the insulation between the two polys is decreased and simultaneously the reliability and durability are improved. At this point it is to be noted, that a decrease of the input resistance value $R_{on}$ on the one hand causes a decrease of the current consumption and on the other hand a decreased heat generation of a corresponding circuit. With regard to the increasing integration densities of semiconductors, these are decisive advantages compared to conventional solutions.

It is a further advantage of the invention that the reliability of the structure, for example, the transistor, is improved. If the transistor remains in one state for a longer period of time (switched on or switched off), then the gate-poly and the source-poly (or also the further polys already mentioned above) remain on the same potential, so that the dielectric between gate-poly and source-poly is not subjected to a voltage load. By this, the life time of the transistors is improved.

Before the figures are described separately in the following, it is to be noted here, that those illustrations are not in perfect scale. Thus, in one embodiment the figures allow no conclusions regarding vertical dimensions with regard to a main surface or a surface of a substrate of the illustrated electronic device, respectively, with the embodiments of the terminal structures, and neither do lateral dimensions of the corresponding structures allow conclusions with regard to concrete dimensionings of implementations of the embodiments. Image projection ratios selected in the figures are rather determined with respect to a clear illustration and discussion of the embodiments. Thus, in one embodiment the figures allow no conclusion regarding thickness ratios of layers with respect to each other. Likewise, the figures allow no conclusions regarding characteristic lengths of lateral structures, and especially small structures are often illustrated substantially larger to describe the embodiments of the present invention.

FIG. 1 illustrates a three-dimensional spatial view of a conventional power transistor consisting of several identical functional elements arranged in a semiconductor substrate.

The conventional power transistor includes a source area 2 within the semiconductor substrate, a body area 4, a drift area 6 and gate electrodes 8a and 8b. The transistor type, that is, the doping of the individual areas, is not necessary for the basic understanding, and is thus not described in the following, just like the potentials applied to the terminals. In an on state, in the body area 4 directly adjacent to the gate electrodes 8a and 8b, conductive channels are formed, whose spatial expansion is indicated by the area 10. Here, the current flow through the transistor is perpendicular through the semiconductor substrate, which is why the same is provided with a source terminal 12 at its upper side and a drain terminal 12 at its bottom side. Due to the vertical alignment of the transistor, the overall current strength to be switched may be increased by the fact that the individual identical transistor cells, in whose centers the gate electrodes which are arranged in trenches 16a and 16b are located, are arranged in a greater spatial proximity to each other, so that more conducting channel area results per chip area. In order to positively influence a drift of the charge carriers in the drift area 6, in each area of the trenches 16a and 16b extending within the drift area 6 additional electrodes 9a and 9b are arranged such that they are located between the gate electrodes and a trench bottom and are electrically insulated from the substrate.

Here, one problem is the necessary electrical contacting of the source area 2 and the body area 4. In this regard, it is first to be noted, that for the desired forming of an electrical contact with a lower contact resistance between a metallization and a semiconductor a semiconductor area forming the contact is necessary including a high charge carrier concentration, that is, which is highly doped. A contacting of the source area in FIG. 1 is generally possible from the top, the body area 4 has to be contacted with an additional structure, however, for geometrical reasons, which enables the contacting within the semiconductor substrate.

Figure 2:
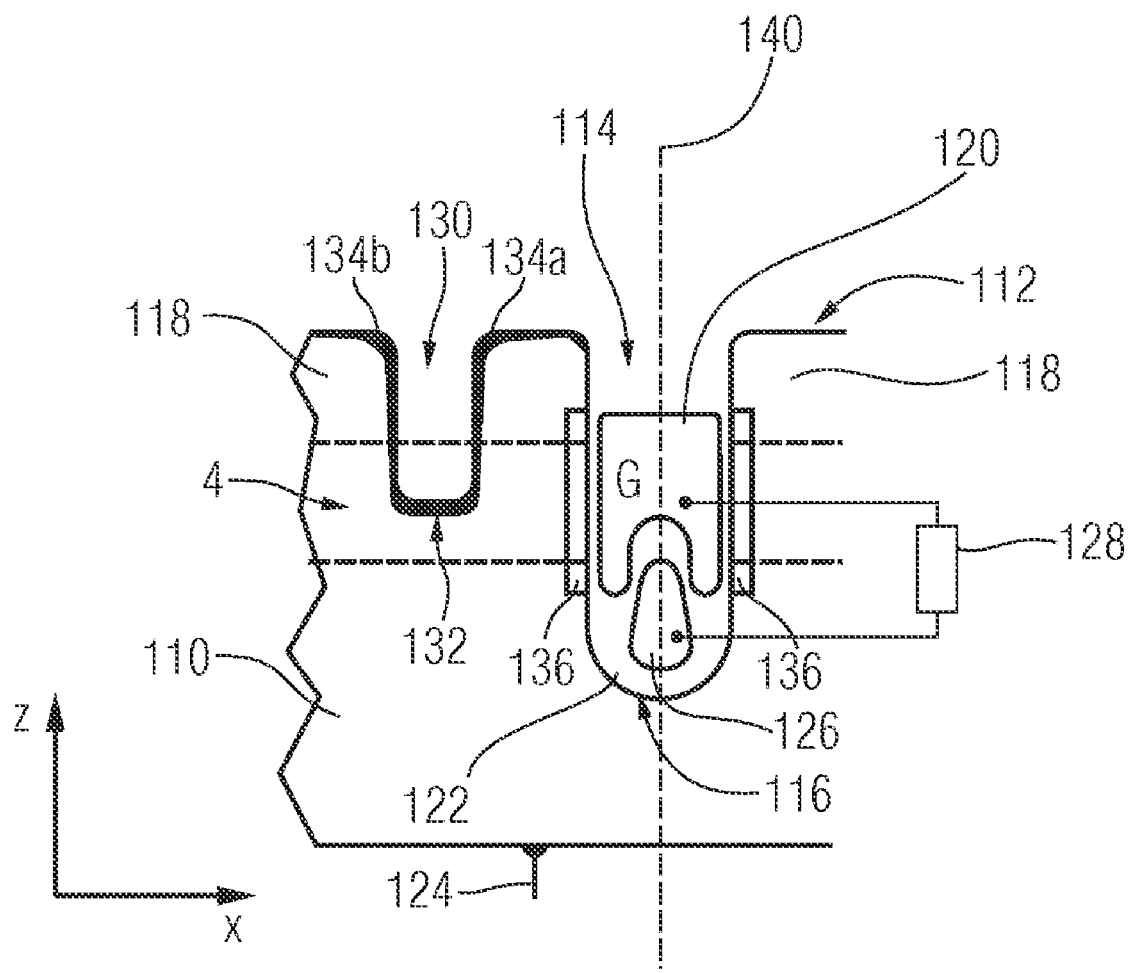
FIG. 2 illustrates a cross-sectional view of a power transistor having an additional trench in a source area according to one embodiment of the present invention.

With power transistors, the source and body contacts are frequently realized by a trench contact, as it is additionally illustrated in the cross-sectional illustration of the power transistor in FIG. 2.

FIG. 2 shows a cross-sectional view along the zx plane of an embodiment of the present invention. One substrate 110 includes a trench 114 having a trench bottom 116 and a trench edge along a surface 112. A source area 118 is formed at the trench edge and a gate electrode 120 is at least partially implemented within the trench 114. The gate electrode 120 is separated from the substrate 110 by an insulation layer 122. At one side of the substrate 110 facing away from the surface 112 a drain electrode 124 is formed. Between the gate electrode 120 and the trench bottom 116 an additional electrode 126 is located which is electrically insulated from the substrate 110. The additional electrode 126 and the gate electrode 120 are connected to each other via an electrical connection 128, wherein the electrical connection 128 includes a predetermined ohmic resistance. The dashed line 140 indicates a cross-sectional line along which a cross-sectional view is later illustrated in FIG. 3.

The embodiment of FIG. 2 shows a contact trench 130 which illustrates a substantial improvement regarding a contacting as compared to the conventional power transistor illustrated in FIG. 1. The contact trench 130 reaching from the surface 112 into the body area 4 of the semiconductor substrate 110 makes contacting of body area 4 basically possible. The highly doped contact areas are illustrated in FIG. 2 by the areas set off dark, wherein the body area 4 is contacted via a highly doped area 132 implanted into the trench bottom, while the source areas may be contacted via highly doped areas 134a and 134b in the top area of the trench 130.

In principle, contactings of the source area 118 are basically also possible from the surface 112 of the semiconductor substrate 110, in practice, the integration densities are so high, however, that between the contact trench 130 and the trench 114 at the surface 112 no room is available anymore, as the trench is spatially arranged in direct proximity to the contact trench 130. Contacting the source area 118 via the insides of the contact trench 130 solves this problem, as it is indicated by the highly doped source areas 134a and 134b. With the power transistor, the source and body contact are thus frequently realized by a trench contact, wherein the source contact 134 is implemented at the sidewall and the body contact at the trench bottom 132. Here, the contact resistance of the source sidewall terminal contact is determined by the doping of the source layer, wherein the higher the layer is doped, the lower is the impedance of the contact resistance.

Due to the high integration density, the high doping concentrations necessary for a good contact resistance have to include extreme gradients within the semiconductor substrate, as the high doping concentrations may otherwise negatively influence the other transistor areas which are arranged within a minimum spatial distance. In the manufacturing of the source, thus a trade-off regarding the transistor characteristics (location of the channel or pn transition, which defines the breakthrough characteristics, characteristics of the body diode, source layer resistance, bipolar impedance, avalanche robustness, sidewall implantation) and the optimum preconditions for a good n contact has to be found.

Figure 3:
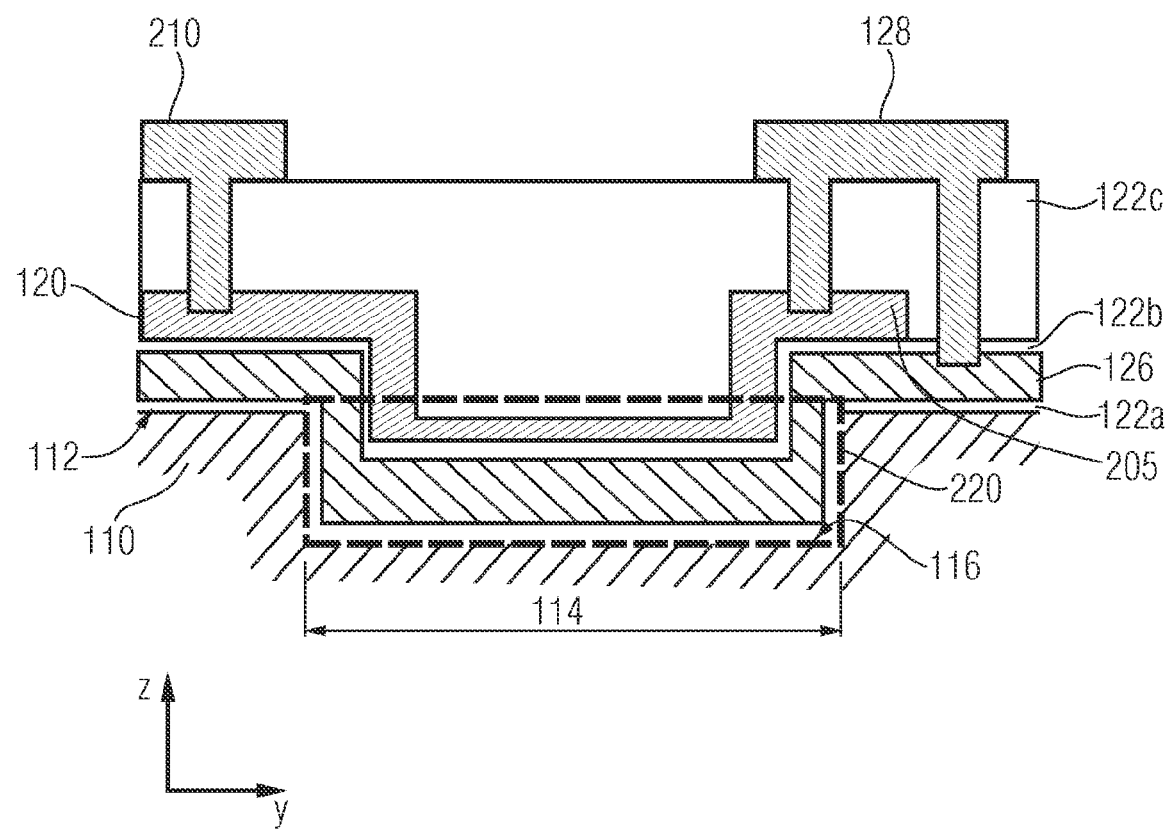
FIG. 3 illustrates a further cross-sectional view along a trench of a power transistor according to one embodiment.

FIG. 3 shows a cross-sectional view of an embodiment along the dashed line 140 of FIG. 2, that is, in parallel to the zy plane. Again, a substrate 110 with a surface 112 is shown, in which the trench 114 is implemented and the trench 114 includes a trench bottom 116. Thus, the indicated cross-sectional view is implemented along a longitudinal expansion (in y direction) of the trench 114, and it may be seen from this embodiment how the individual electrodes may be led out of the trench 114 laterally in the y direction. As the bottommost insulation layer on the substrate 110, here a first insulation layer 122a is implemented, on which the additional electrode 126 is implemented and which is followed again by a second insulation layer 122b. On top of that, the gate electrode 120 is implemented, and as the last layer, a third insulation layer 122c was applied to the structure.

In the selected cross-sectional view, the first and the second insulation layer 122a and 122b and also the additional electrode 126 were completely led out of the trench in the y direction, wherein the gate electrode 120 was only led out of the trench partially or, in more detail, only up to point 205 on the one side of the trench (in the selected illustration on the right side) along the y direction. It is to be noted, that leading out the layers here refers to the y direction, but not to the x direction (see FIG. 2). Leading out the layers enables a through contacting of the gate electrode 120 and also of the additional electrode 126 by using the electrical connection 128 which bridges the third insulation layer 122c. The electrical connection 128 here includes a predetermined electrical resistance value, so that a potential equalization between the gate electrode 120 and the additional electrode 126 only takes place after a certain time delay. An electrical contacting of the gate electrode 120 may for example take place on the side of the trench 114 opposite to the electrical connection 128 in the y direction. This again may take place by a through contacting of the third insulation layer 122c towards a contact terminal 210, which may, for example, include a metal.

FIG. 3 shows merely an example for a possible implementation of the ohmic contact or the electrical connection 128, respectively, wherein possible materials for the substrate 110 are a silicon semiconductor material, which is for example suitably doped, and the additional electrode 126 and the gate electrode 120 may for example include polycrystalline silicon, which is why both electrodes may also be referred to as poly electrodes, poly layers or simply as polys. The second insulation layer 122b is for example a so called polox layer, that is, an insulation layer arranged between polys. The first insulation layer 122a forms a layer implemented into a so called field plate, so that this layer may for example withstand a strong field strength gradient without damage. The third insulation layer 122c may for example be a so called inter-level dielectric (of the MOS structure) which may in one embodiment act as an exterior protection layer. The dashed line 220 indicates, as mentioned above, the cross-sectional plane in parallel to the trench 114, and is positioned through the center of the extension in the x direction (see FIG. 2) of the trench. The MOS structure indicated here is also referred to as a poly (double) poly trench MOS having an ohmic source-poly-gate-poly contact.

Figure 4:
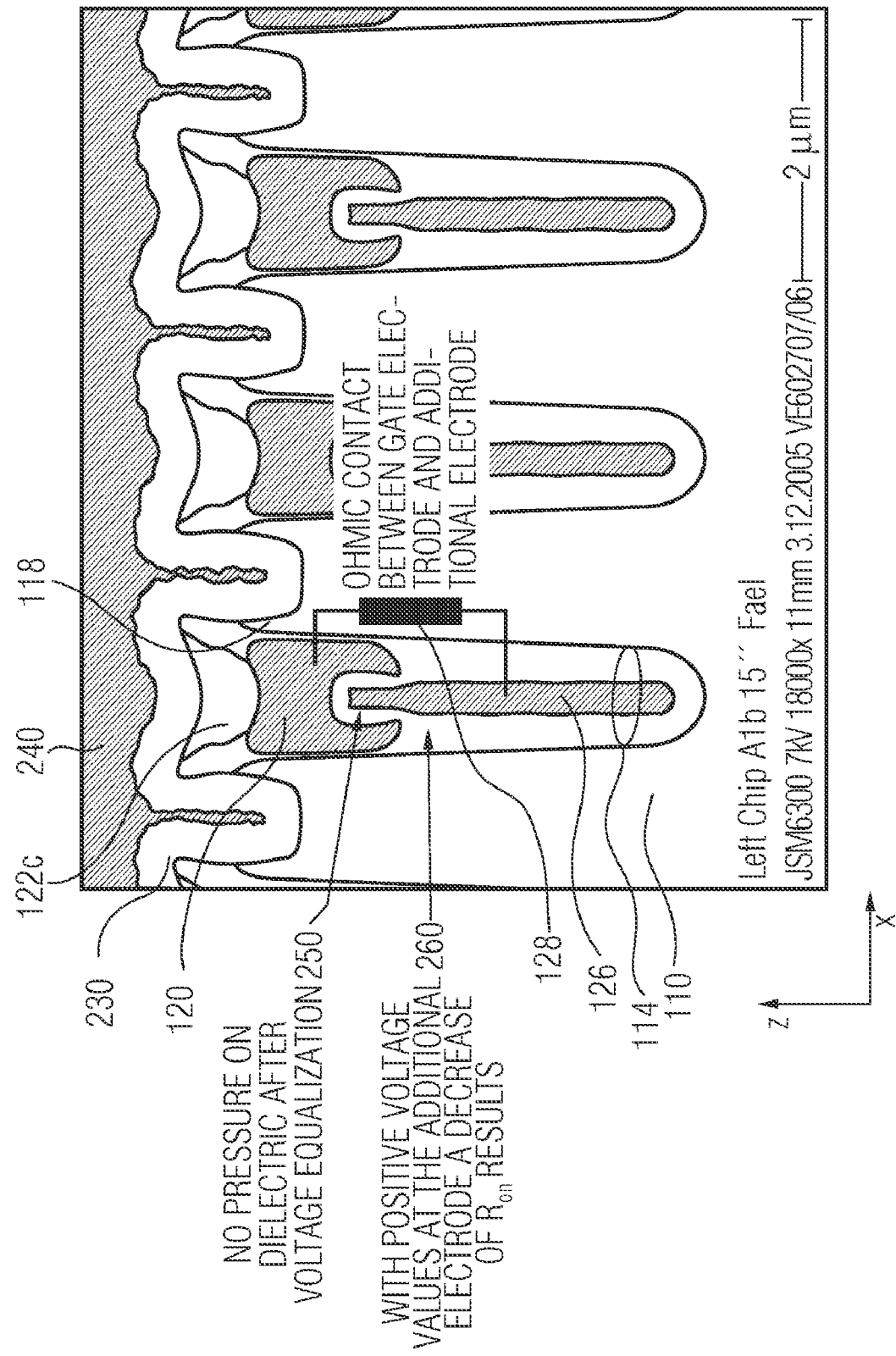
FIG. 4 illustrates an electron microscope recording of a cross-section perpendicular to the trench of the power transistor.

FIG. 4 shows an electron microscope recording of a cross-sectional view corresponding to the illustration of FIG. 2. This means, the cross-sectional view is again implemented in the zx plane, wherein the trench 114 extends from the trench bottom to the trench edge along the z direction. Here, the ohmic contact or the electrical connection 128, respectively, is shown schematically which electrically connects the gate electrode 120 and the additional electrode 126. The electrical connection 128 includes a predetermined ohmic resistance and may alternatively also establish an electrical connection between the additional electrode 126 and a voltage source (not shown) for the gate electrode 120. Apart from that, a contact layer 230 providing a terminal for the source area 118 and finally a cover layer 240 are applied. The cover layer 240 for example serves as a protection and insulation layer and the contact layer 230 for example includes an electrically conductive material.

After a potential equalization between the gate electrode 120 and the additional electrode 126, the dielectric between the gate electrode 120 and the additional electrode 126 (see arrow 250) is not subjected to a pressure as a result of a voltage difference any more. In case a positive voltage or a voltage having the same sign as the gate voltage, respectively, is applied to the additional electrode 126, a reduction of the input resistance value $R_{on}$ results (see arrow 260).

The form for an ohmic contact illustrated in FIG. 4 between the gate electrode 120 and the additional electrode 126 for a poly-poly MOS is only schematical, however. The ohmic contact 128 may be realized in another location of the device, as illustrated in the embodiment of FIG. 3. Further, the indicated scale (dimension) of 2 µm illustrates, that a possible depth of the trench may be in an area from for example 1 to 4 µm and the trench may include a width in the x direction of for example 0.2 to 1.5 µm. Further, the additional electrode 126 may include a thickness in the x direction of for example 0.1 to 1 µm and the gate electrode may include a layer thickness in the x direction of for example 0.3 to 1.2 µm.

Figure 5:
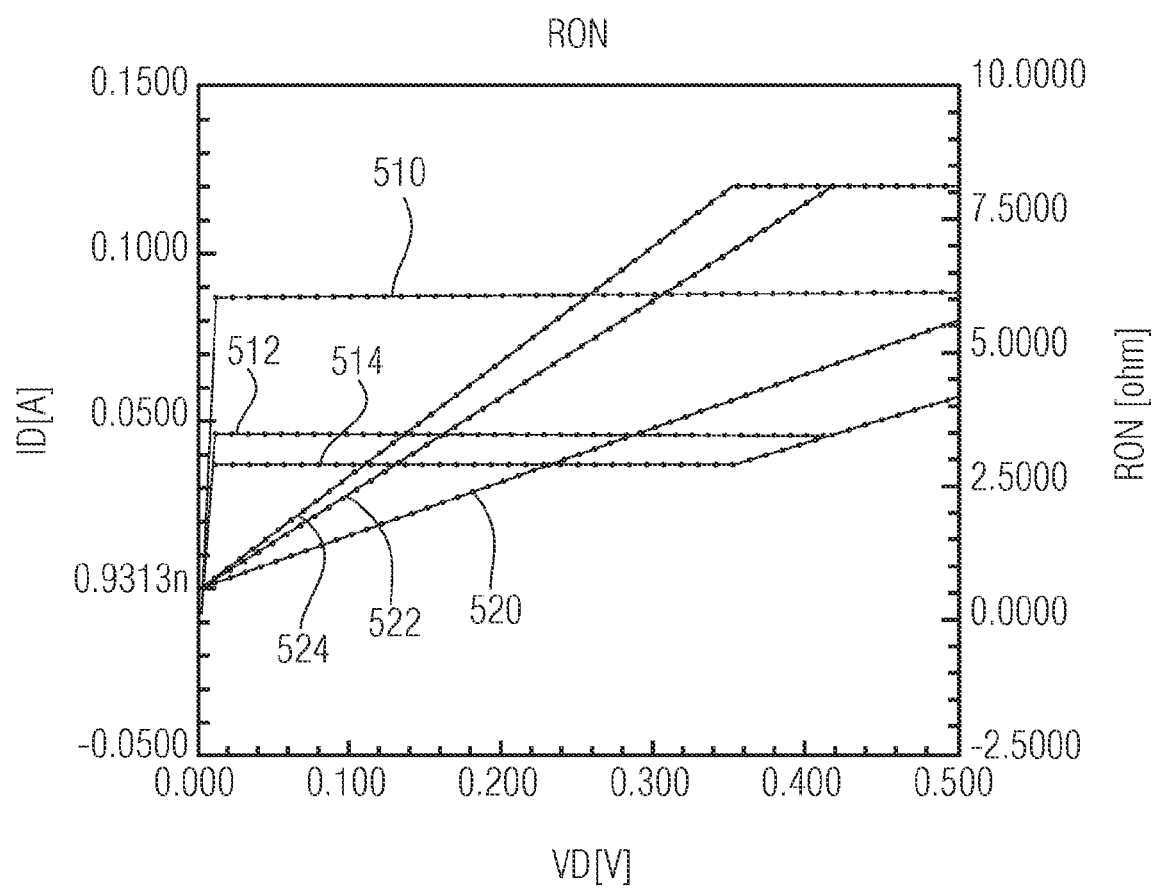
FIG. 5 illustrates a graphical illustration of the change of the input resistance $R_{on}$ according to one embodiment.

In FIG. 5, graphs for illustrating a decrease of the switch-on resistance $R_{on}$ of the power transistor (for example, of the poly-poly MOS trench transistor) are illustrated. These graphs were obtained for a PCM transistor SFET4MV with a separate source-poly contact. Selected parameters for these graphs are a gate voltage of 10 volts and a variable drain voltage in a range between 0 and 0.5 volts, a source potential of 0 volts and a source-poly potential for the values of −10, 0 or +10 volts.

The graphs 510, 512 and 514 illustrate the functional connection between the switch-on resistance $R_{on}$ in dependence on the drain voltage VD. On the other hand, the graphs 520, 522, 524 illustrate the connection of the drain current strength in ampere in dependence on the drain voltage VD. The graph 510 here relates to a voltage of −10 volts, applied to the source-poly (additional electrode 126) and provides, as indicated, an input resistance value of approximately $R_{on}$=6.3 ohm. The graph 512 here relates to a voltage of 0 volts at the source-poly 126 and provides an input resistance value of approximately $R_{on}$=3.5 ohm, and the graph 524 relates to a voltage of +10 volts at the source-poly 126 and provides an input resistance value of approximately $R_{on}$=2.9 ohm. The corresponding current-voltage characteristics are indicated by the graph 520, 522 and 524. In one embodiment, the graph 520 shows the current-voltage characteristic providing the graph 510, the graph 522 shows the current-voltage characteristic for the graph 512 and finally, graph 524 shows the current-voltage characteristic for the graph 514.

By a comparison of the graphs 510 and 512 it thus turns out, that the input resistance value $R_{on}$ is already clearly decreased, when the gate voltage and the voltage at the additional electrode 126 include the same sign (or already when the voltage at the additional electrode 126 vanishes, respectively, like for graph 512). The input resistance value $R_{on}$ however, clearly decreases again, when the voltage of the source-poly 126 is adjusted to the gate voltage, as indicated in graph 514, where both include a value of +10 volts. In the present example, this effect amounts to an exemplary further decrease by approximately 15%, that is, of around 3.5 ohm (in graph 512) to about 2.9 ohm (in graph 514). The indicated values are only examples, however, and may deviate for other selected parameters.

With some embodiments, after a potential equalization between the gate electrode 120 and the additional electrode 126, a decrease of the input resistance value $R_{on}$ is achieved and thus the power loss may be decreased. In some embodiments, the reliability of the field-effect transistor (for example, a poly-poly trench MOS transistor) is improved. The increase of the reliability is achieved in one embodiment by the fact that a voltage decline between the gate electrode 120 and the additional electrode 126 takes place and thus the corresponding dielectric layer, which separates the gate electrode 120 and the additional electrode 126 in the trench area, is not exposed to pressure anymore. Apart from that, a decrease of the input resistance value $R_{on}$ takes already place for the case that the voltage of the source-poly (that is, the additional electrode 126) includes a value of for example greater than zero (or the same sign as the gate voltage, respectively). This may be seen from FIG. 5, if you compare graph 510 which corresponds to a negative voltage of the source-poly 126 to graph 512, wherein graph 512 corresponds to the case of a vanishing voltage at the source-poly. When the voltage of the source-poly in the selected embodiment is further increased, that is, when it takes on positive values, a further decrease of the input resistance value $R_{on}$ results.

Although embodiments of the present invention are described with reference to field-effect transistors, it is to be noted that the invention is not limited to field-effect transistors. Embodiments of the invention generally relate to semiconductor structures with a substrate 110 in which in a trench 114 a first electrode 120 and the additional electrode 126 are formed, wherein on the substrate 110 a further electrode 118 is provided. Also here, a conductive connection 128 with a predetermined ohmic resistance value is formed between the first electrode 120 and the additional electrode 126.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
   a substrate having a surface;
   a trench formed in the surface and having a trench bottom and a trench edge;
   a source area implemented at the trench edge;
   a gate electrode at least partially implemented in the trench and separated from the substrate by an insulation layer;
   a gate contact contacting the gate electrode;
   a drain electrode at a side of the substrate;
   an additional electrode implemented between the gate electrode and the trench bottom and electrically insulated from the substrate; and
   an electrical connection with a predetermined ohmic resistance value coupled between the additional electrode and the gate electrode,
   wherein the predetermined ohmic resistance value is selected so that an equalization of potential between the gate electrode and the additional electrode takes place after a time delay, and
   wherein the gate contact and the electrical connection are provided on opposite sides of the trench.

2. The semiconductor of claim 1, wherein the electrical connection comprises a doped polycrystalline material and the semiconductor component is a field-effect transistor.

3. A field-effect transistor, comprising:
a substrate comprising a surface along which a trench is formed, wherein the trench comprises a trench bottom and a trench edge;
a source area implemented at the trench edge;
a gate electrode at least partially implemented in the trench and separated from the substrate by an insulation layer;
a gate contact contacting the gate electrode;
a drain electrode at a side of the substrate facing away from the surface;
an additional electrode which is implemented between the gate electrode and the trench bottom and is electrically insulated from the substrate; and
an electrical connection between the additional electrode and the gate electrode,
wherein the electrical connection comprises a predetermined ohmic resistance value, and
wherein the predetermined ohmic resistance value is selected so that an equalization of potential between the gate electrode and the additional electrode takes place after a time delay, and
wherein the gate contact and the electrical connection are provided on opposite sides of the trench.

4. The field-effect transistor of claim 3, wherein the electrical connection comprises a doped polycrystalline material.

5. The field-effect transistor of claim 3, wherein the gate electrode and the additional electrode are led out of the trench and the electrical connection contacts the gate electrode and the additional electrode outside the trench.

6. The field-effect transistor of claim 3, wherein the gate electrode comprises polycrystalline silicon.

7. The field-effect transistor of claim 3, wherein the additional electrode comprises polycrystalline silicon.

8. The field-effect transistor of claim 3, wherein the source area is formed by a doped area of the substrate.

9. The field-effect transistor of claim 3, wherein a substrate area between the trench bottom and the surface forms a channel area of the field-effect transistor.

10. The field-effect transistor of claim 3, wherein the gate electrode and the additional electrode are formed by layers extending along the trench and running across a trench edge area in parallel to the surface and which are electrically separated within the trench by the insulation layer.

11. A semiconductor structure comprising a recess formed in a surface area of a semiconductor substrate, comprising a bottom and an edge, comprising:
a first means to provide a first electrical contact, wherein the first means is implemented at the edge;
a second means to provide an electrical control contact, wherein the second means is at least partially implemented in the trench and separated from the semiconductor substrate by an insulation layer;
a third means which is implemented between the second means and the bottom and electrically insulated from the semiconductor substrate;
a fourth means between the third means and the second means to decrease a switch-on resistance of the field-effect transistor, wherein the fourth means comprises a predetermined ohmic resistance value; and
a fifth means to provide an external contact for the second means and connected to the second means,
wherein the predetermined ohmic resistance value is selected so that an equalization of potential between the gate electrode and the additional electrode takes place after a time delay, and
wherein the fourth means and the fifth means are provided on opposite sides of the trench.

12. The semiconductor structure of claim 11, comprising a sixth means to provide a second electrical contact, wherein the sixth means is implemented at a side of the semiconductor substrate facing away from the surface area, wherein the third means influences a current flow between the first means and the sixth means.

13. The semiconductor structure of claim 11, wherein the fourth means comprises a doped semiconductor material and the predetermined ohmic resistance value is determined by a selected doping.

14. The semiconductor structure of claim 11, wherein the predetermined ohmic resistance of the fourth means is set by a geometry of the fourth means.

15. A method for manufacturing a field-effect transistor, comprising:
providing a substrate with a surface,
forming a trench along the surface of the substrate, wherein the trench comprises a trench bottom and a trench edge;
forming a source area;
forming a gate electrode which is at least partially implemented within the trench;
forming a gate contact contacting the gate electrode;
forming a drain electrode at a side of the substrate facing away from the surface;
forming an additional electrode between the gate electrode and the trench bottom;
forming an insulation layer between the gate electrode and the substrate between the substrate and the gate electrode and between the substrate and the additional electrode; and
forming an electrical connection between the additional electrode and the gate electrode,
wherein forming an electrical connection between the additional electrode and the gate electrode comprises setting an ohmic resistance value of the electrical connection such that an equalization of potential between the gate electrode and the additional electrode takes place after a time delay, and
wherein the gate contact and the electrical connection are formed on opposite sides of the trench.

16. The method of claim 15, wherein the electrical connection comprises a predetermined ohmic resistance value.

17. The method of claim 15, wherein forming an electrical connection includes leading out the gate electrode and the additional electrode of the trench and further forming an ohmic contact outside the trench.

18. The method of claim 15, wherein forming the gate electrode or forming the additional electrode includes using a polycrystalline semiconductor material.

19. The method of claim 15, wherein the additional electrode comprises a semiconductor material and the predetermined ohmic resistance is set by a doping of the semiconductor material.

20. The method of claim 15, further comprising forming a channel area in an area of the substrate between the trench bottom and the surface.

* * * * *